United States Patent [19]

Drummond et al.

[11] Patent Number: 5,402,019
[45] Date of Patent: Mar. 28, 1995

[54] PHASE STARTABLE CLOCK DEVICE

[75] Inventors: William S. Drummond, Cornelius; Arthur J. Metz, Gervais; Walter D. Fields, Beaverton, all of Oreg.

[73] Assignee: Tektronix, Inc., Wilsonville, Oreg.

[21] Appl. No.: 926,101

[22] Filed: Aug. 6, 1992

[51] Int. Cl.⁶ .............................................. H03K 5/06
[52] U.S. Cl. ..................... 327/237; 327/356; 327/361; 327/91
[58] Field of Search ................ 307/262, 529; 328/155

[56] References Cited

U.S. PATENT DOCUMENTS

| 5,008,571 | 4/1991 | Rudish | 307/529 |
| 5,051,614 | 9/1991 | Ohta | 307/529 X |
| 5,103,352 | 4/1992 | Moon et al. | 307/262 X |
| 5,157,276 | 10/1992 | Metz | 307/262 |

Primary Examiner—Willis R. Wolfe, Jr.
Attorney, Agent, or Firm—John Smith-Hill; Boulden G. Griffith

[57] ABSTRACT

Apparatus for generating a phase startable clock signal, comprises an oscillator for providing a continuous sinusoidal input signal, a control signal source for providing a control input signal having a transition between a first state and a second state at a selected time during the signal epoch of the sinusoidal input signal, and a phase splitter, track and holds, multipliers and a summation device for operating on the sinusoidal input signal with the control input signal to produce a sinusoidal output signal commencing with a predetermined phase at a predetermined time relative to the transition.

23 Claims, 3 Drawing Sheets

PHASE STARTABLE CLOCK DEVICE

BACKGROUND OF THE INVENTION

This invention relates to a phase startable clock device.

In a high speed digitizing instrument, an analog input signal is sampled and quantized during an acquisition interval under control of a sampling clock signal. The sampling clock signal may be, or may be derived from, a high frequency sinusoidal signal. It may be desired that the high frequency sinusoidal signal start with a known phase at a fixed time following a control signal transition that is representative of a trigger event. It is known to generate such a high frequency sinusoidal signal using a circuit known as a phase startable clock.

One form of phase startable clock comprises an oscillator and means for disabling and enabling the oscillator loop. The oscillator loop is in the enabled condition immediately before the control signal transition arrives. When the control signal transition arrives, the oscillator loop is temporarily disabled, so that the oscillator stops, and is then re-enabled. This synchronizes the oscillator output in time with respect to the control signal transition such that the oscillator starts with a known phase at a known time relative to the transition. Ideally, the oscillator should turn-off immediately and turn-on immediately upon receiving the control signal transition. In reality, however, the circuit elements within the oscillator require time to allow transients to settle. Therefore, the phase startable clock suffers a time penalty (the delay between receipt of the control signal transition and availability of the sinusoidal output signal). The time penalty depends on the Q of the elements within the oscillator.

Because of the desire to minimize the time penalty, prior phase startable clocks have used oscillators with low Q elements within the oscillator loop. However, an oscillator with low Q elements suffers long term jitter (instability of the oscillator's signal over the acquisition interval during which the analog input signal is sampled). Conversely, use of high Q elements to improve jitter performance results in an increase in the time penalty. The jitter performance for previous phase startable clocks has been limited according to a desire to minimize the time penalty.

SUMMARY OF THE INVENTION

In accordance with a first aspect of the present invention there is provided a method of generating a phase startable clock signal, comprising providing a continuous sinusoidal input signal, providing a control input signal having a transition between a first state and a second state at a selected time during the signal epoch of the sinusoidal input signal, and operating on the sinusoidal input signal with the control input signal to produce a sinusoidal output signal commencing with a predetermined phase at a predetermined time relative to said transition.

In accordance with a second aspect of the present invention there is provided an apparatus for generating a phase startable clock signal, comprising a first means for providing a continuous sinusoidal input signal, a second means for providing a control input signal having a transition between a first state and a second state at a selected time during the signal epoch of the sinusoidal input signal, and a third means for operating on the sinusoidal input signal with the control input signal to produce a sinusoidal output signal commencing with a predetermined phase at a predetermined time relative to said transition.

A preferred phase startable clock device embodying the invention comprises a phase splitter for receiving an input sinusoidal signal and producing outputs of predetermined phase, and samplers for receiving the outputs of the phase splitter and receiving control signals. Each sampler operates upon one of the phase splitter outputs according to a control signal input and produces an output equivalent to the phase splitter output signal when the control signal is in a disable mode. When the control signal is in an enable mode, the sampler produces a fixed voltage output equivalent to the phase splitter output signal at the time of the transition from the disable state of the control signal to its enable state. The optionally delayed outputs of the phase splitter are multiplied with outputs of the samplers, and the multiplication products are summed to produce a sinusoidal output signal having a predetermined phase at a predetermined time with respect to the transition of the control signal.

A phase startable clock device embodying the invention operates upon an already existing, stable sinusoidal input signal and produces a sinusoidal output signal which begins at a predetermined phase regardless of the phase of the input signal. Using a phase startable clock device embodying the invention, a sinusoidal output signal can be synchronized with the control signal transition independent of the phase of the already existing sinusoidal input signal. The jitter performance of the sinusoidal output signal is comparable to that of the sinusoidal input signal, with very little degradation caused by the phase startable clock device.

BRIEF DESCRIPTION OF THE DRAWINGS

For a better understanding of the invention, and to show how the same may be carried into effect, further reference will be made by way of example, to the accompanying drawings in which.

DETAILED DESCRIPTION

Figure 1:
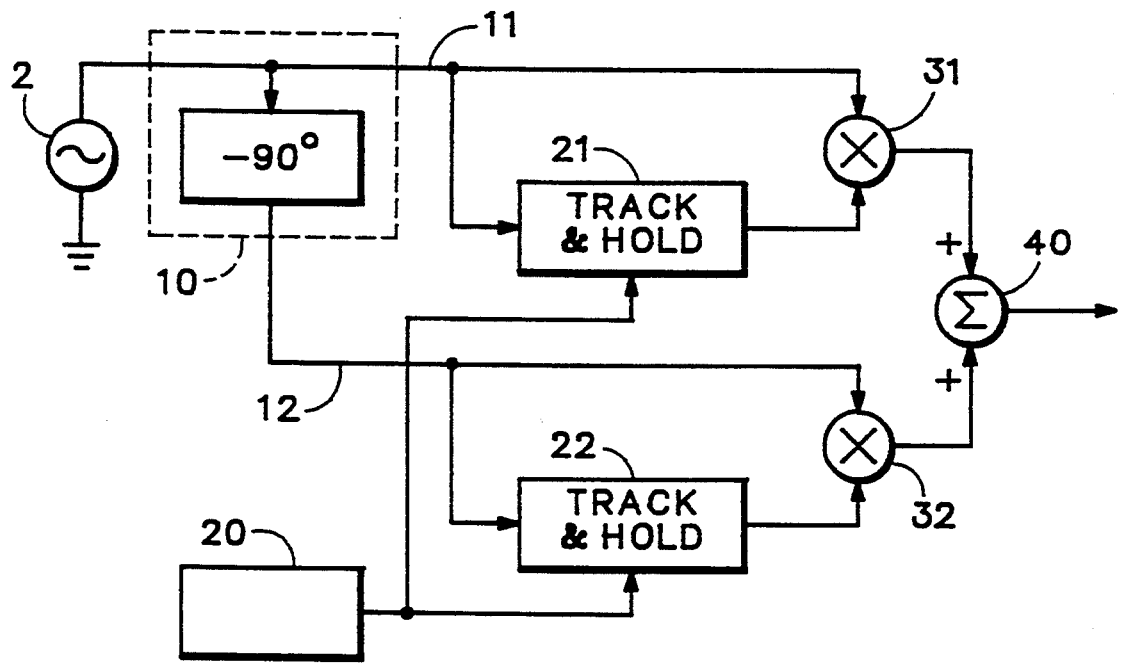
FIG. 1 is a block diagram of a first phase startable clock device embodying the invention.

The phase startable clock device shown in FIG. 1 comprises an oscillator 2 that generates a sinusoidal signal $\cos(wt+\alpha)$. The sinusoidal signal is applied to a phase splitter 10 which splits the sinusoidal signal into an in-phase signal $\cos(wt+\alpha)$ at a node 11 and a quadrature signal $\sin(wt+\alpha)$ at a node 12. The in-phase signal from the phase splitter 10 is delivered to a first input of a four-quadrant multiplier 31 and to the analog input of a first track and hold or sampler 21.

The first track and hold 21 has a control port that is connected to a control signal source 20. When the control signal is in one state, the track and hold is in a disable, or track, state and when the control signal is in its other state, the track and hold is in an enable, or hold, state. When the first track and hold is in the disable state, the track and hold operates upon the in-phase signal received at its analog input port to produce an output signal that is the same as its input signal. When the control signal transitions to the enable state, the output from the track and hold maintains a fixed voltage equivalent to that which was present at its analog input upon receiving the transition of the control signal. The output of the first track and hold is applied to the second input of the first four-quadrant multiplier 31.

The first four-quadrant multiplier 31 multiplies the phase splitter's in-phase output signal and the first track and hold's output signal. In four-quadrant multiplication, a multiplication of two positives equals a positive, a multiplication of a positive and a negative equals a negative, and a multiplication of two negatives produces a positive. The output of the first four-quadrant multiplier 31 is delivered to one of the summation input ports of a summation device 40.

The phase splitter's quadrature output signal is applied to both the analog input of a second track and hold 22, which receives the same control signal as the first track and hold 21, and the first input of a second four-quadrant multiplier 32. The output of the second track and hold 22 is applied to the second input of the second four-quadrant multiplier 32, which multiplies the phase-splitter's quadrature output signal and the output of the second track and hold to produce an output signal that is applied to the other summation input port of the summation device 40. The summation device combines the signals from the first multiplier 31 and second multiplier 32 to produce an analog output signal.

When the control signal is in the disable mode, the analog output signal of summation device 40 is given by:

$$\cos^2(wt+\alpha) + \sin^2(wt+\alpha)$$

Thus, the output signal is a fixed voltage of unit magnitude. If the control signal transitions from the disable to the enable state at time $t=T$, the track and holds 21 and 22 hold the constant output signals $\cos(wT+\alpha)$ and $\sin(wT+\alpha)$ respectively, and the analog output signal is then given by:

$$\cos(wt+\alpha)*\cos(wT+\alpha) + \sin(wt+\alpha)*\sin(wT+\alpha)$$

which is equal to $\cos(wt+\gamma)$, where $\gamma$ is $-wT$, i.e. a constant.

It will therefore be seen that the phase startable clock device shown in FIG. 1 operates by gating the output of the oscillator so that in one state the output of the gate does not vary with time whereas in the other state the output of the gate varies sinusoidally at the same frequency as the sinusoidal output signal of the oscillator.

The phase startable clock device shown in FIG. 1 produces a sinusoidal output signal beginning at a known phase $(wt+\gamma=0)$ immediately upon receiving the control signal transition. The time penalty from transition to start-up of the sinusoidal output signal depends only on the propagation delays of the track and holds, the multipliers, and the summation device.

Long-term jitter performance of the sinusoidal output signal depends on the stability of the oscillator 2. Since the oscillator 2 is free-running and is not a startable oscillator, it is not necessary to use low Q elements in the oscillator in order to minimize the time penalty. Therefore, the oscillator 2 may be constructed with high Q elements, so that it operates with a high degree of stability and provides good long-term jitter performance.

In the embodiment shown in FIG. 1, an amplitude imbalance in the outputs of the phase splitter adds an AC component at twice the output frequency of the oscillator 2 to the constant output in the disable state. In the enable state, this amplitude variation leads to so-called deterministic jitter. Other non-idealities in components used in the device shown in FIG. 1, such as gain and offset errors in the track and holds 21 and 22 and in the input ports of the multipliers 31 and 32, phase errors in the output signals of the phase splitter 10, and non-linearity of the summation device 40 may also lead to deterministic jitter. In order to minimize the deterministic jitter, it is necessary that components of the device shown in FIG. 1 be well matched. Matching may be facilitated by implementing the device in an integrated circuit.

Figure 2:
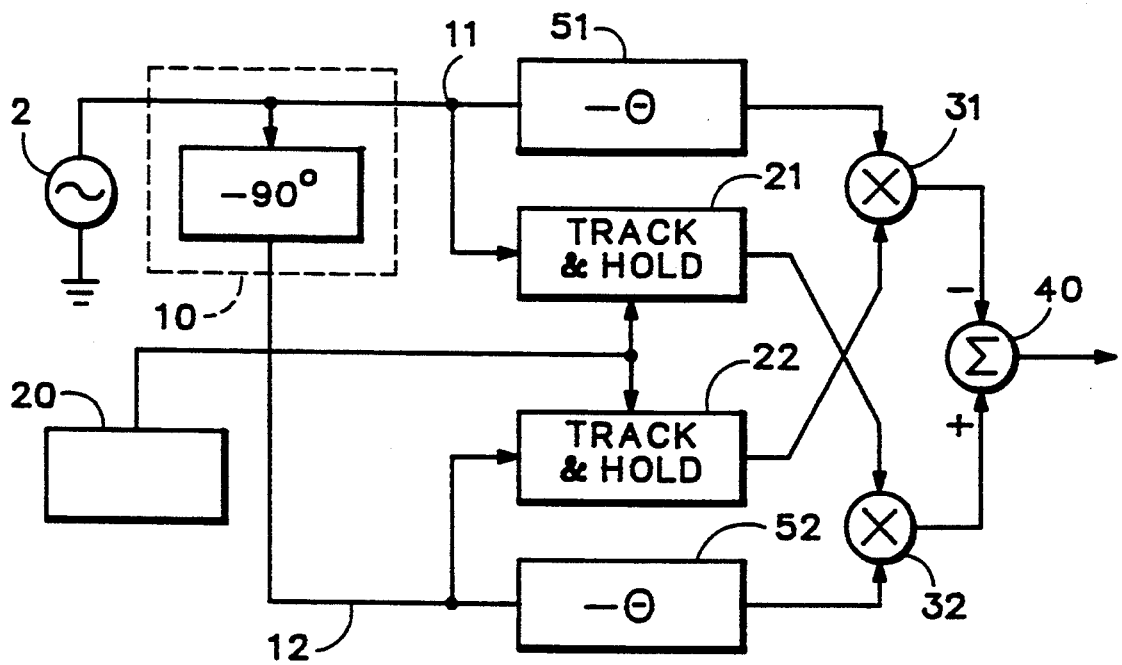
FIG. 2 is a block diagram of a second phase startable clock device embodying the invention.

Deterministic jitter in the operation of the device shown in FIG. 1 may be reduced by operation at lower signal amplitudes, so that the various components operate in a more linear part of their range, but since the thermal noise is fixed this results in a decrease in signal-to-noise ratio. The phase startable clock device shown in FIG. 2 provides a reduction in deterministic jitter due to amplitude and phase errors in the output signals of the phase splitter without causing an increase in thermal noise. Further, the phase startable clock device shown in FIG. 2 allows compensation for finite delays in the track and holds.

In the case of FIG. 2, the in-phase output 11 of the phase splitter 10 is connected to a first input of multiplier 31 via a phase delay element 51 and is connected to a first input of multiplier 32 via the track and hold 21. Similarly, the quadrature output 12 of the phase splitter is connected to a second input of the multiplier 32 via a phase delay element 52 and is connected to a second input of the multiplier 31 via the track and hold 22. With the control signal in the disable state, the first multiplier 31 produces the signal $\sin(wt+\alpha-\delta)*\cos(wt+\alpha-\Theta)$ and the second multiplier 32 produces the signal $\cos(wt+\alpha-\delta)$, $\sin(wt+\alpha-\Theta)$, where $\delta$ represents the phase delay in each of the track and holds. The outputs from the two multipliers 31 and 32 are combined in the summation device 40 to produce an analog output signal given by:

$$\cos(wt+\alpha-\delta)*\sin(wt+\alpha-\Theta) - \sin(wt+\alpha-\delta)*\cos(wt+\alpha-\Theta)$$

If the phase delay $\Theta$ imposed by elements 51 and 52 is equal to the phase delay $\delta$ imposed by the track and holds, the two input signals to the summation circuit are equal while the track and holds are in the disable state and therefore the output signal is zero. If the control signal transitions from the disable state to the enable state at time $t=T$, the track and holds 21, 22 hold the values $\cos(wT+\alpha-\delta)$ and $\sin(wT+\alpha-\delta)$ respectively, and the analog output signal is given by:

$$\cos(wT+\alpha-\delta)*\sin(wt+\alpha-\delta) - \sin(wT+\alpha-\delta)*\cos(wt+\alpha-\delta)$$

which is equal to $\sin(wt+\gamma)$. For $t=T$, $\sin(wt+\gamma)$ is equal to zero and so the analog output signal starts at zero, allowing a minimum time delay from receiving the control signal transition to the starting of an output sinusoidal signal at a zero crossing.

By adjusting the delay elements 51, 52 of the device shown in FIG. 2 for delays other than mere propagation compensation, the starting phase of the output signal of the summation device may be placed at any point on a sinusoidal curve.

In the ideal case, cross-multiplying the in-phase and quadrature signals eliminates the effects of amplitude and phase errors in the output signals of the phase splitter and therefore the device shown in FIG. 2 has better deterministic jitter performance than the device shown in FIG. 1.

Figure 3:
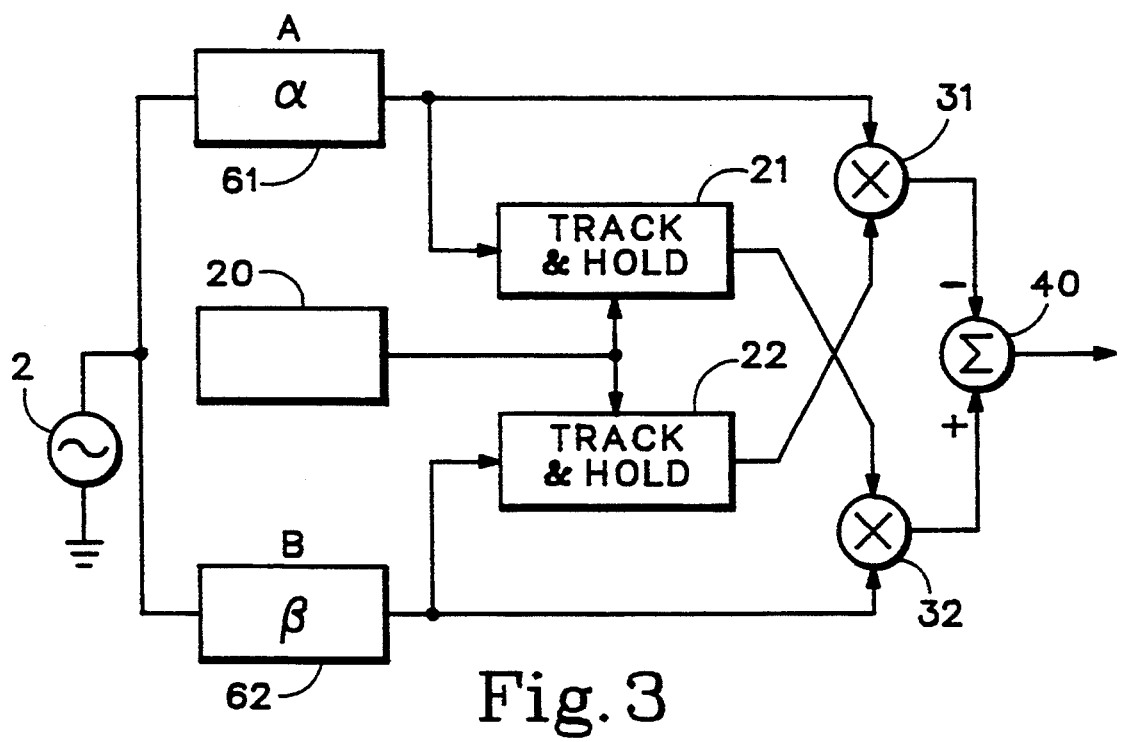
FIG. 3 is a block diagram of a generalized form of the phase startable clock device shown in FIG. 2.

FIG. 3 shows a more general version of the phase startable clock device shown in FIG. 2. In the case of FIG. 3, the sinusoidal signal from the oscillator 2 is applied to phase shifters 61 and 62. The phase shifter 61 has a gain of A and imposes a phase shift $\alpha$, whereas the phase shifter 62 has a gain of B and imposes a phase shift $\beta$. Accordingly, the output signals of the phase shifters are given by $A\cos(wt+\alpha)$ and $B\cos(wt+\beta)$ respectively. The delays in the track and holds 21, 22 are lumped in the delays $\alpha$, $\beta$. The output of the phase shifter 61 is applied to the track and hold 21 and multiplier 31, and the output of the phase shifter 62 is applied to the track and hold 22 and phase shifter 32. Assuming that the track and holds each impose a phase delay $\delta$, the output signals of the track and holds in the disable state are given by $A\cos(wt+\alpha-\delta)$ and $B\cos(wt+\beta-\delta)$ respectively. The outputs of the multipliers 31 and 32 are applied to the summation circuit 40, which provides the output $AB[\cos(wt+\alpha)\cos(wt+\beta-\delta)-\cos(wt+\beta)\cos(wt+\alpha-\delta)]$ which is equal to $-AB\sin\delta\sin(\alpha-\beta)$, i.e. a constant.

If the track and holds transition to the enable state at time $t=T$, the analog output signal of the summation circuit 40 is given by $-AB\sin[w(t-T)+\Theta]\sin(\alpha-\beta)$.

The invention is not restricted to the phase splitter providing only two output signals, and is applicable to the phase splitter having any number of output phases. By way of example, FIG. 4 shows a phase startable clock device in which the input signal is split into three phases which are then processed and recombined.

Figure 4:
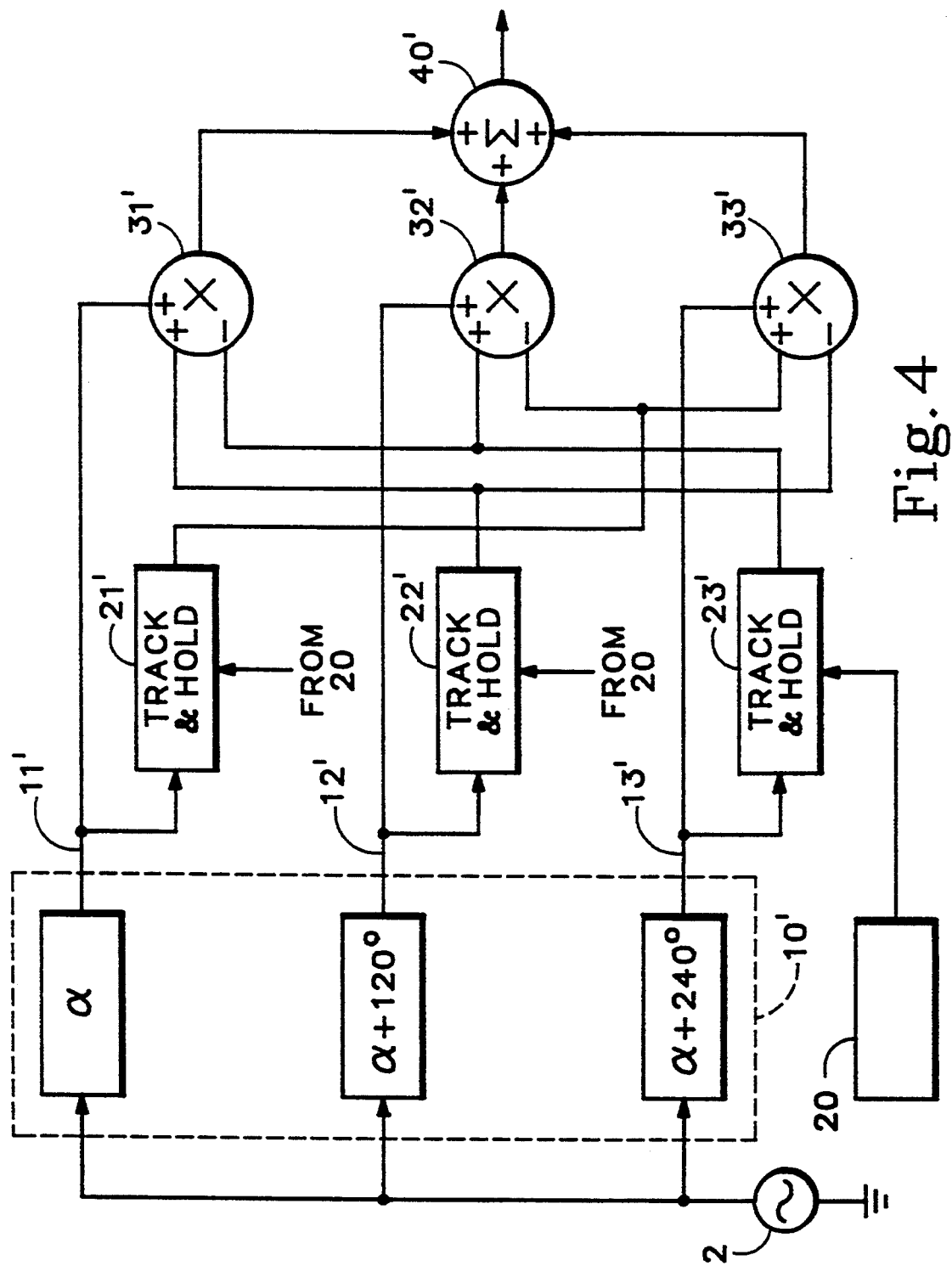
FIG. 4 is a block diagram of a further phase startable clock device embodying the invention.

In the device shown in FIG. 4, a sinusoidal input signal is applied to a three-phase splitter 10'. The phase splitter 10' produces three output signals a(t), b(t) and c(t) at its outputs 11', 12' and 13' respectively. The three output signals are separated in phase from each other by 120°. The first output 11' of the phase splitter is applied to a first track and hold 21' and to the continuous input of a first multiplier 31', the second output 12' of the phase splitter is applied to a second track and hold 22' and to the continuous input of a second multiplier 32', and the third output 13' of the phase splitter is applied to a third track and hold 23' and to the continuous input of a third multiplier 33'.

Each of the multipliers also has a differential input. The output signals a'(t), b'(t) and c'(t), of the first, second and third track and holds respectively, are applied to the differential inputs of the multipliers 31', 32' and 33' such that the first multiplier 31' provides the output signal a(t)*(b'(t)−c'(t)), the second multiplier 32' provides the output signal b(t)*(c'(t)−a'(t)), and the third multiplier provides the output signal c(t)*(a'(t)−b'(t)). These three signals are brought together in a summation device 40' to produce an output signal a(t)*(b'(t)−c'(t))+b(t)*(c'(t)−a'(t))+c(t)*(a'(t)−b'(t)).

In the tracking state, ignoring delays in the track and holds, the functions a'(t), b'(t) and c'(t) are the same as a(t), b(t) and c(t) respectively, and it can be shown that if the signal a(t) is given by $\sin(wt+\alpha)$, the output signal of the summation device 40' is zero. If the transition to the hold state takes place at a time $t=T$, then a'(t), b'(t) and c'(t) are equal to the constants a(T), b(T) and c(T) respectively, and it can be shown that the output signal of the summation device 40' is directly proportional to $\sin(wt-wT)$.

The invention is not restricted to multipliers receiving the outputs of the phase splitter at their continuous inputs and the outputs of the track and holds at their differential inputs, since it can be shown that with appropriate adjustments the continuous inputs can receive the outputs of the track and holds and the differential inputs can receive the outputs of the phase splitter.

The preferred four-quadrant multipliers are of a known type that produces primarily third harmonic distortion. The track and holds also produce third harmonic distortion. Since the phase difference between the three signals provided by the phase splitter 10' of FIG. 4 is 120°, which corresponds to one period of the third harmonic, the third harmonic distortion created in any one of the three different paths will be coherent with the third harmonic distortion created in the other two paths and the third harmonic distortion products created in any of the circuits preceding the multipliers and/or in the multiplier inputs themselves will be canceled at the summation device if the amplitudes of the third harmonic distortions in the three paths respectively are identical. By reducing the third harmonic distortion, the deterministic jitter is reduced and this allows the multipliers to operate with a greater signal amplitude, which will improve the signal-to-noise ratio and thus improve the jitter characteristics of the output signal.

It will be appreciated that the invention is not restricted to the particular embodiments that have been described, and that variations may be made therein without departing from the scope of the invention as defined in the appended claims and equivalents thereof.

We claim:

1. A method of generating a phase startable clock signal, comprising:
   (a) providing a continuous sinusoidal input signal,
   (b) providing a control input signal having a transition between a first state and a second state at a selected time during the signal epoch of the sinusoidal input signal, and
   (c) operating on the sinusoidal input signal with the logic control input signal to produce a sinusoidal output signal commencing with a predetermined phase at a predetermined time relative to said transition.

2. A method according to claim 1, wherein step (c) comprises:
   splitting the sinusoidal input signal into first and second split sinusoidal signals of predetermined phase,
   multiplying the first split sinusoidal signal by a signal representative of a constant X to produce a first product signal,
   multiplying the second split sinusoidal signal by a signal representative of a constant Y to produce a second product signal, and
   summing the first and second product signals to produce the sinusoidal output signal.

3. A method according to claim 2, wherein X and Y are the values of the first and second split sinusoidal signals at the time of said transition.

4. A method according to claim 2, wherein X and Y are the values of the second and first split sinusoidal signals at time of said transition.

5. A method according to claim 2, wherein the first and second split sinusoidal signals are in quadrature with one another.

6. A method according to claim 1, wherein step (c) comprises:
splitting the sinusoidal input signal into first and second split sinusoidal signals of predetermined phase,
delaying the first split sinusoidal signal to produce a first delayed signal,
delaying the second split sinusoidal signal to produce a second delayed signal,
multiplying the first delayed signal by a signal representative of a constant X to produce a first product signal,
multiplying the second delayed signal by a signal representative of a constant Y to produce a second product signal, and
sunning the first and second product signals to produce the sinusoidal output signal.

7. A method according to claim 6, wherein X and Y are the values of the second and first split sinusoidal signals at the time of said transition.

8. A method according to claim 6, wherein the first and second split sinusoidal signals are in quadrature with one another.

9. A method according to claim 1, wherein step (c) comprises:
splitting the sinusoidal input signal into first, second and third split sinusoidal signals a(t), b(t) and c(t) respectively, the three split sinusoidal signals being of predetermined phase,
multiplying the first split sinusoidal signal by b(T)−c(T) to provide a first product signal,
multiplying the second split sinusoidal signal by c(T)−a(T) to provide a second product signal,
multiplying the third split sinusoidal signal by a(T)−b(T) to provide a third product signal, and
summing the first, second and third product signals to produce the sinusoidal output signal,
wherein a(T), b(T), and c(T) are the values of the first, second and third split sinusoidal signals at the time of said transition.

10. A method according to claim 9, wherein the predetermined phases of the first, second and third sinusoidal signals are 0°, 120° and 240° respectively.

11. Apparatus for generating a phase startable clock signal, comprising:
a first means for providing a continuous sinusoidal input signal,
a second means for providing a control input signal having a transition between a first state and a second state at a selected time during the signal epoch of the sinusoidal input signal, and
a third means for operating on the sinusoidal input signal with the control input signal to produce a sinusoidal output signal commencing with a predetermined phase at a predetermined time relative to said transition.

12. An apparatus according to claim 11, wherein said third means comprises:
a means for splitting the sinusoidal input signal into first and second split sinusoidal signals of predetermined phase,
a means for providing a signal representative of a constant X,
a first multiplier means for multiplying the first split sinusoidal signal by the signal representative of the constant X and producing a first product signal,
a means for providing a signal representative of a constant Y,
a second multiplier means for multiplying the second split sinusoidal signal by the signal representative of the constant Y and producing a second product signal, and
a means for summing the first and second product signals to produce the sinusoidal output signal.

13. An apparatus according to claim 12, wherein X and Y are the values of the first and second split sinusoidal signals at the time of said transition.

14. An apparatus according to claim 12, wherein X and Y are the values of the second and first split sinusoidal signals at the time of said transition.

15. An apparatus according to claim 12, wherein the means for splitting the sinusoidal input signal comprises a means for splitting the sinusoidal input signal into first and second split sinusoidal signals that are in quadrature with one another.

16. An apparatus according to claim 11, wherein said third means comprises:
a means for splitting the sinusoidal input signal into first and second split sinusoidal signals of predetermined phase,
a first delay means for delaying the first split sinusoidal signal to produce a first delayed signal,
a second delay means for delaying the second split sinusoidal signal to produce a second delayed signal,
a means for providing a signal representative of a constant X,
a first multiplier means for multiplying the first delayed signal by the signal representative of the constant X to produce a first product signal,
a means for providing a signal representative of a constant Y,
a second multiplier means for multiplying the second delayed signal by the signal representative of the constant Y to produce a second product signal, and
a means for summing the first and second product signals to produce the sinusoidal output signal.

17. An apparatus according to claim 16, wherein X and Y are the values of the second and first split sinusoidal signals at the time of said transition.

18. An apparatus according to claim 16, wherein the means for splitting the sinusoidal input signal comprises a means for splitting the sinusoidal input signal into first and second split sinusoidal signals that are in quadrature with one another.

19. An apparatus according to claim 11, wherein said third means comprises:
a means for splitting the sinusoidal input signal into first, second and third split sinusoidal signals a(t), b(t) and c(t) of predetermined phase,
a first multiplier means for multiplying the first split sinusoidal signal by b(T)−c(T) to produce a first product signal,
a second multiplier means for multiplying the second split sinusoidal signal by c(T)−a(T) to produce a second product signal,
a third multiplier means for multiplying the third split sinusoidal signal by a(T)−b(T) to produce a third product signal, and
a means for summing the first, second and third product signal to produce the sinusoidal output signal, wherein a(T), b(T) and c(T) are the values of the first, second and third split sinusoidal signals at the time of said transition.

20. An apparatus according to claim 19, wherein the predetermined phases of the first, second and third split sinusoidal signals are 0°, 120° and 240° respectively.

21. A phase startable clock apparatus comprising:

a quadrature splitter means for receiving a sinusoidal input signal and providing first and second sinusoidal output signals in quadrature, a first delay means for receiving the quadrature splitter means' first sinusoidal output signal and producing a first delayed output signal identical to the quadrature splitter means' first sinusoidal output signal with a phase lag of Θ, a second delay means for receiving the quadrature splitter means' second sinusoidal output signal and producing a second delayed output signal identical to the quadrature splitter means' second sinusoidal output signal with a phase lag of Θ, a first sampling means having an analog input for receiving the quadrature splitter means' first sinusoidal output signal, an analog output for providing an analog output signal, and a control input for receiving a control signal having an enable state and a disable state such that when the control signal is in the disable state the first sampling means produces an analog output signal that is identical to the analog input signal, and when the control signal is in the enable state, the sampling means holds at its analog output the voltage that was present at its analog input at the time the control signal transitioned from the disable state to the enable state, a second sampling means having an analog input for receiving the quadrature splitter means' second sinusoidal output signal, an analog output for providing an analog output signal, and a control input for receiving the control signal such that when the control signal is in the disable state, the second sampling means produces an analog output signal that is identical to the analog input signal, and when the control signal is in the enable state the sampling means holds at its analog output the voltage that was present at its analog input at the time the control signal transitioned from the disable state to the enable state, first and second multiplier means for each receiving two analog input signals and providing an analog output signal that is the product of the two analog input signals, wherein the first multiplier means receives its two analog input signals from the second delay means and the first sampling means' analog output respectively, and the second multiplier means receives its two input signals from the first delay means and the second sampler means' analog output respectively, and a summation means for combining the analog output signals from the first and second multiplier means and producing an analog output signal.

22. A phase startable clock apparatus comprising:

a phase splitter means for receiving a sinusoidal input signal and producing a first split sinusoidal signal, a second split sinusoidal signal having a 120° phase difference with the first split sinusoidal signal, and a third split sinusoidal signal having a 240° phase difference with the first split sinusoidal signal and a 120° phase difference with the second split sinusoidal signal, a first sampling means having an analog input for receiving the first split sinusoidal signal, an analog output for providing an analog output signal (a'(t)), a control input for receiving a control signal having an enable state and a disable state such that when the control signal is in the disable state, the first sampling means produces an analog output signal that is identical to the analog input signal, and when the control signal is in the enable state, the sampling means holds at its analog output the voltage that was present at its analog input at the time the control signal transitioned from the disable state to the enable state, a second sampling means having an analog input for receiving the second split sinusoidal signal, an analog output for providing an analog output signal (b'(t)), and a control input for receiving the control signal such that when the control signal is in the disable state, the second sampling means produces an analog output signal that is identical to the analog input signal, and when the control signal is in the enable state, the sampling means holds at its analog output the voltage that was present at its analog input at the time the control signal transitioned from the disable state to the enable state, a third sampling means having an analog input for receiving the third split sinusoidal signal, an analog output for providing an analog output signal (c'(t)), a control input for receiving the control signal such that when the control signal is in the disable state, the third sampling means produces an analog output signal that is identical to the analog input signal, and when the control signal is in the enable state, the sampling means holds at its analog output the voltage that was present at its analog input at the time the control signal transitioned from the disable state to the enable state, a first multiplier means having a continuous input for receiving the third split sinusoidal signal, a differential input for receiving the difference between the first and second sampling means' analog output signals, and an analog output for providing a first product output signal, the first multiplier means being operative to multiply the continuous input signal with the differential input signal to produce the first product output signal, a second multiplier means having a continuous input for receiving the first split sinusoidal signal, a differential input for receiving the difference between the second and third sampling means' analog output signals, and an analog output for providing a second product output signal, the second multiplier being operative to multiply the continuous input signal with the differential input signal to produce the second product output signal, a third multiplier means having a continuous input for receiving the second split sinusoidal signal, a differential input for receiving the difference between the third and first sampling means' analog output signals, and an analog output for providing a third product output signal, the third multiplier being operative to multiply the continuous input signal with the differential input signal to produce the third product output signal, and a summation means for combining the first, second and third product output signals to produce an output signal.

23. A phase startable clock apparatus comprising:

a quadrature splitter means for receiving a sinusoidal input signal and providing first and second sinusoidal output signals in quadrature, a first sampling means having an analog input for receiving the quadrature splitter means' first sinusoidal output signal, an analog output for providing an analog output signal, and a control input for receiving a control signal having an enable state and a disable state such that when the control signal is in the disable state, the first sampling means produces an analog output signal that is identical to the analog input signal, and when the control signal is in the enable state, the sampling means holds at its analog output the voltage that was present at its analog input at the time the control signal transitioned from the disable state to the enable state, a second sampling means having an analog input for receiving the quadrature splitter means' second sinusoidal output signal, an analog output for providing an analog output signal, and a control input for receiving the control signal such that when the control signal is in the disable state, the second sampling means produces an analog output signal that is identical to the analog input signal, and when the control signal is in the enable state, the sampling means holds at its analog output the voltage that was present at its analog input at the time the control signal transitioned from the disable state to the enable state, first and second multiplier means for each receiving two analog input signals and providing one analog output signal that is the product of the two analog input signals, wherein the first multiplier means receives its two analog input signals from the quadrature splitter's first sinusoidal output and the first sampling means' analog output respectively, and the second multiplier means receives its two analog input signals from the quadrature splitter's second analog output and the second sampling means' analog output respectively, and a summation means for combining the analog output signals from the first and second multiplier means and producing an analog output signal.

* * * * *